United States Patent
Setlur et al.

(10) Patent No.: US 7,321,191 B2
(45) Date of Patent: Jan. 22, 2008

(54) PHOSPHOR BLENDS FOR GREEN TRAFFIC SIGNALS

(75) Inventors: Anant Achyut Setlur, Niskayuna, NY (US); Emil Vergilov Radkov, Euclid, OH (US); Alok Mani Srivastava, Niskayuna, NY (US); Stanton Earl Weaver, Northville, NY (US); Thomas Elliot Stecher, Scotia, NY (US); Holly Ann Comanzo, Niskayuna, NY (US)

(73) Assignee: Lumination LLC, Valley View, OH (US)

( * ) Notice: Subject to any disclaimer, the term of this patent is extended or adjusted under 35 U.S.C. 154(b) by 256 days.

(21) Appl. No.: 10/979,912

(22) Filed: Nov. 2, 2004

(65) Prior Publication Data
US 2006/0091778 A1 May 4, 2006

(51) Int. Cl.
| C09K 11/06 | (2006.01) |
| H01L 33/00 | (2006.01) |
| H01J 1/62 | (2006.01) |
| H01J 63/04 | (2006.01) |

(52) U.S. Cl. .................. 313/487; 313/486; 313/512; 313/503; 313/485; 257/89; 257/90; 257/94; 257/95; 252/301.16

(58) Field of Classification Search ............... 313/486, 313/485, 512
See application file for complete search history.

(56) References Cited

U.S. PATENT DOCUMENTS

| 6,278,135 | B1 | 8/2001 | Srivastava et al. |
| 6,429,583 | B1 | 8/2002 | Levinson et al. |
| 6,466,135 | B1 | 10/2002 | Srivastava et al. |
| 6,501,100 | B1 | 12/2002 | Srivastava et al. |
| 6,555,958 | B1 | 4/2003 | Srivastava et al. |
| 6,580,097 | B1 | 6/2003 | Soules et al. |
| 6,621,211 | B1 | 9/2003 | Srivastava et al. |
| 6,649,946 | B2 | 11/2003 | Bogner et al. |
| 6,657,379 | B2 | 12/2003 | Ellens et al. |
| 6,670,748 | B2 | 12/2003 | Ellens et al. |
| 6,717,353 | B1 | 4/2004 | Mueller et al. |
| 6,809,781 | B2 * | 10/2004 | Setlur et al. .......... 252/301.4 F |
| 2003/0094893 | A1 | 5/2003 | Ellens et al. |
| 2004/0062951 | A1 * | 4/2004 | Kita et al. ................. 313/504 |

FOREIGN PATENT DOCUMENTS

EP    1 403 355 A1    3/2004

* cited by examiner

Primary Examiner—Sikha Roy
Assistant Examiner—Natalie K. Walford
(74) Attorney, Agent, or Firm—Fay Sharpe LLP

(57) ABSTRACT

There is provided a blue-green illumination system, including a semiconductor light emitter, and a luminescent material, wherein the system has an emission with CIE color coordinates located within an area of a of a pentagon on a CIE chromaticity diagram, whose corners have the following CIE color coordinates: i) x=0.0137 and y=0.4831; ii) x=0.2240 and y=0.3890; iii) x=0.2800 and y=0.4500; iv) x=0.2879 and y=0.5196; and v) x=0.0108 and y=0.7220. The luminescent material includes two or more phosphors. The illumination system may be used as the green light of a traffic light or an automotive display.

19 Claims, 8 Drawing Sheets

FIG. 2
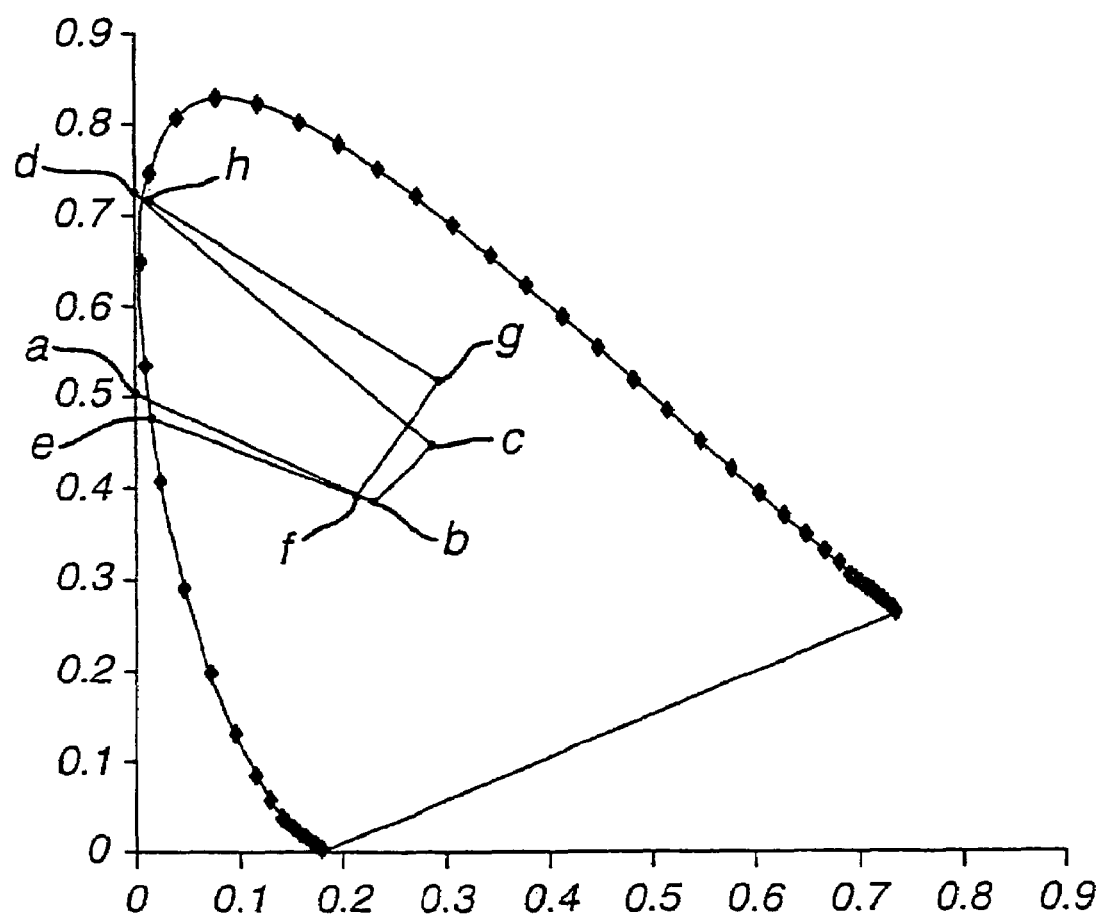
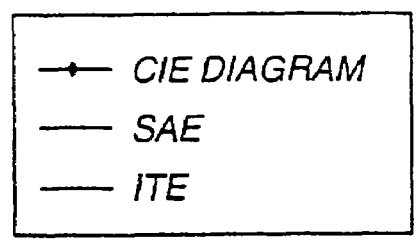

PHOSPHOR BLENDS FOR GREEN TRAFFIC SIGNALS

BACKGROUND

The present exemplary embodiments relate to novel phosphor compositions. They find particular application in conjunction with converting LED-generated ultraviolet (UV), violet or blue radiation into green light or other colored light for use in green traffic signals. It should be appreciated, however, that the invention is also applicable to the conversion of LED and other light source radiation for the production of green light for other applications, such as display lights, etc.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum.

By interposing a phosphor excited by the radiation generated by the LED, light of a different wavelength, e.g., in the visible range of the spectrum, may be generated. Colored LEDs are used in a number of commercial applications such as toys, indicator lights, automotive, display, safety/emergency, directed area lighting and other devices. Manufacturers are continuously looking for new colored phosphors for use in such LEDs to produce custom colors and higher luminosity.

One important application of semiconductor LEDs is as a light source in a traffic light. Presently, a plurality of blue-green emitting LEDs containing II-V semiconductor layers, such as GaN, etc., are used as the green light of a traffic signal (i.e. traffic lights).

Industry regulations often require traffic light colors to have very specific CIE color coordinates. For example, according to the Institute of Transportation Engineers (ITE), a green traffic light in the United States is typically required to have emission CIE color coordinates located within an area of a quadrilateral on a CIE chromaticity diagram, whose corners have the following color coordinates:

a) x=0.000 and y=0.506;
b) x=0.224 and y=0.389;
c) x=0.280 and y=0.450; and
d) x=0.000 and y=0.730.

The following CIE color coordinates are most preferred for green traffic light applications: x=0.1 and y=0.55.

Likewise, industry regulations require automotive display colors to have specific CIE color coordinates. According to the Society of Automotive Engineers (SAE), a green automotive display, such as a vehicle dashboard display, is typically required to have emission CIE color coordinates located within an area of a quadrilateral on a CIE chromaticity diagram, whose corners have the following color coordinates:

e) x=0.0137 and y=0.4831;
f) x=0.2094 and y=0.3953;
g) x=0.2879 and y=0.5196; and
h) x=0.0108 and y=0.7220.

The color coordinates (also known as the chromaticity coordinates) and the CIE chromaticity diagram are explained in detail in several text books, such as on pages 98-107 of K. H. Butler, "Fluorescent Lamp Phosphors" (The Pennsylvania State University Press 1980) and on pages 109-110 of G. Blasse et al., "Luminescent Materials" (Springer-Verlag 1994), both incorporated herein by reference.

Presently, GaN based LEDs are designed to emit blue-green light with a peak wavelength of 505 nm, which has the desired CIE color coordinates of x=0.1 and y=0.55. Such devices include LEDs having an $In_{1-x}Ga_xN$ active layer manufactured according to desired parameters. However, LEDs with the $In_{1-x}Ga_xN$ active layer suffer from the following disadvantage. Due to frequent deviations from desired parameters (i.e., manufacturing systematic variations), the LED peak emission wavelength typically deviates from 505 nm, and thus, its CIE color coordinates deviate from the desired x=0.1 and y=0.55 values. For example, the LED color output (e.g., spectral power distribution and peak emission wavelength) varies with the band gap width of the LED active layer. One source of deviation from the desired color coordinates is the variation in the In to Ga ratio during the deposition of the $In_{1-x}Ga_xN$ active layer, which results in an active layer whose band gap width deviates from the desired value. This ratio is difficult to control precisely during mass production of the LEDs, which leads to inconsistent color coordinates in a given batch of LEDs. Thus, the $In_{1-x}Ga_xN$ LEDs which are suitable for use in traffic lights have a lower production yield because a large number of such LEDs with unsuitable emission color coordinates have to be discarded.

In addition, green LEDs used in green traffic signals based upon InGaN technology are generally inefficient (~30 lm for Lumileds Luxeon green LEDs), especially when compared to blue/violet (380-480 nm) based LED light sources. Higher efficiency green devices will lead to brighter traffic signals and/or more inexpensive signals since the number of LEDs required will be reduced. The present invention is directed to overcoming or at least reducing the problems set forth above through the use of new phosphor blends.

BRIEF DESCRIPTION

In a first aspect, there is provided a blue-green illumination system, including a semiconductor light emitter; and a luminescent material, wherein the illumination system has an emission having CIE color coordinates located within an area of a pentagon on a CIE chromaticity diagram, whose corners have the following CIE color coordinates: x=0.0137 and y=0.4831; x=0.2240 and y=0.3890; x=0.2800 and y=0.4500; x=0.2879 and y=0.5196; and x=0.0108 and y=0.7220 and further wherein the luminescent material includes two or more phosphor compositions selected from the group consisting of: $(Ba,Sr,Ca)_5(PO_4)_3(Cl,F,Br,OH):Eu^{2+}$; $(Ba,Sr,Ca)MgAl_{10}O_{17}:Eu^{2+}$; $(Ba,Sr,Ca)BPO_5:Eu^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*0.2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Ba,Sr,Ca)Al_{2-x}Si_xO_{4-x}N_x:Eu^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+},Ce^{3+}$; $(Ca,Sr)_8(Mg,Zn)(SiO_4)_4Cl_2:Eu^{2+}$; $(Y,Lu,Gd,Tb,Sc)_2(Ca,Mg)_{1-r}(Mg,Zn)_{2+r}Si_{z-q}Ge_qO_{12+\delta}:Ce$; (Y,Gd,Tb,La, $Sm,Pr,Lu)_3(Al,Ga)_5O_{12}:Ce^{3+}$; $Sr-SiON:Eu^{2+},Ce^{3+}$; $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}S_{18}Al_{12}O_{18}N_{36}$, $MSi_5Al_2ON_9$ and $M_xSi_5AlON_{10}$ where M can be a divalent cation like $Ca^{2+}$, $Sr^{2+}$, $Ba^{2+}$ or a trivalent cation like Y/Lu/Gd/Sc/Tb/La doped with $Eu^{2+}$ and/or $Ce^{3+}$; and $(Mg,Ca,Sr,Ba)_pSi_qAl_rO_xN_y$, where $1 \leq p \leq 16$; $0 \leq q < 30$; $0 \leq r < 15$, $0 \leq x < 20$ and $0 < y < 40$ doped with $Eu^{2+}$ and/or $Ce^{3+}$.

In a second aspect, there is provided a rare earth oxynitride phosphor composition having a formula selected from $Lu_{4-x}M_x(Si,Ge)_2N_{2-x}O_{7+x}$ and $LU_{4-x}M_x(Si,Ge)_{2-y}(Al,Ga)_yN_{2-x-y}O_{7+x+y}$:RE where M is at least one of Ca, Sr, Ba, and Zn, $0 \leq x \leq 2$, $0 \leq y \leq 2$, and RE is at least one of the $Ce^{3+}$, $Tb^{3+}$, $Pr^{3+}$, $Dy^{3+}$, $Sm^{3+}$, $Eu^{3+}$, $Eu^{2+}$, $Mn^{2+}$, and $Bi^{3+}$.

In a third aspect, there is provided a rare earth oxynitride phosphor composition having the formula $Ln_3(Ge,Si)_8N_{11}O_4$:RE; where Ln is at least one of Lu, Y, La, Gd and RE is at least one of $Ce^{3+}$, $Tb^{3+}$, $Pr^{3+}$, $Dy^{3+}$, $Er^{3+}$, $Sm^{3+}$, and $Eu^{3+}$.

In a fourth aspect, there is provided a rare earth oxynitride phosphor composition having a formula selected from $Ln_{3-x}M_x(Si,Ge)_8N_{11-x}O_{4+x}$:RE; $Ln_{3-x}M_x(Si,Ge)_{8-x}N_{11-x}O_{4+x}$:RE; or $Ln_{3-x}M_x(Si,Ge)_{8-x}Al_xN_{11-x/2}O_{4-x/4}$:RE where M is at least one of Ca, Sr, Ba and Zn, $0 \leq x \leq 3$, where Ln is at least one of Lu, Y, La, Gd and RE is at least one of the $Ce^{3+}$, $Tb^{3+}$, $Pr^{3+}$, $Dy^{3+}$, $Sm^{3+}$, $Eu^{3+}$, $EU^{2+}$, $Mn^{2+}$, and $Bi^{3+}$.

In a fifth aspect, there is provided a light emitting device including a semiconductor light source having a peak emission from about 250 to about 550 nm and a rare earth oxynitride phosphor selected from one of the above embodiments.

In a sixth aspect, there is provided a phosphor blend including a first rare earth oxynitride phosphor selected from one of the above embodiments, wherein the phosphor blend is capable of emitting light suitable for use in general illumination either alone or in combination with radiation emitted by a semiconductor light source radiationally coupled to the phosphor blend.

BRIEF DESCRIPTION OF THE DRAWINGS

FIG. 2 is a representation of the ITE green traffic light bin on the CIE chromaticity diagram.

DETAILED DESCRIPTION

A phosphor conversion material (phosphor material) converts generated UV or blue radiation to a different wavelength visible light. The color of the generated visible light is dependent on the particular components of the phosphor material. The phosphor material may include only a single phosphor composition or two or more phosphors of basic color, for example a particular mix to emit a desired color (tint) of light. As used herein, the terms "phosphor" and "phosphor material" are intended to include both a single phosphor composition as well as a blend of two or more phosphor compositions.

The present embodiments relate to the use of blends of specific phosphors with UV or blue/violet LEDs to make high efficacy green LEDs with colors suitable for traffic signal applications.

The present inventors have discovered that when at least one luminescent material, such as at least one phosphor, has at least two appropriately selected peak emission wavelengths, a human observer perceives their combined emission as blue-green light. Any luminescent materials, such as phosphors having a first peak emission wavelengths below 505 nm and a second peak emission wavelength above 505 nm may be used in combination with a radiation source to form the blue-green light illumination system. Preferably, the luminescent materials have a high quantum efficiency at a particular emission wavelength of the radiation source. Furthermore, if there is more than one luminescent material, each luminescent material preferably does not significantly absorb the visible light wavelengths emitted by the other luminescent material.

Figure 1:
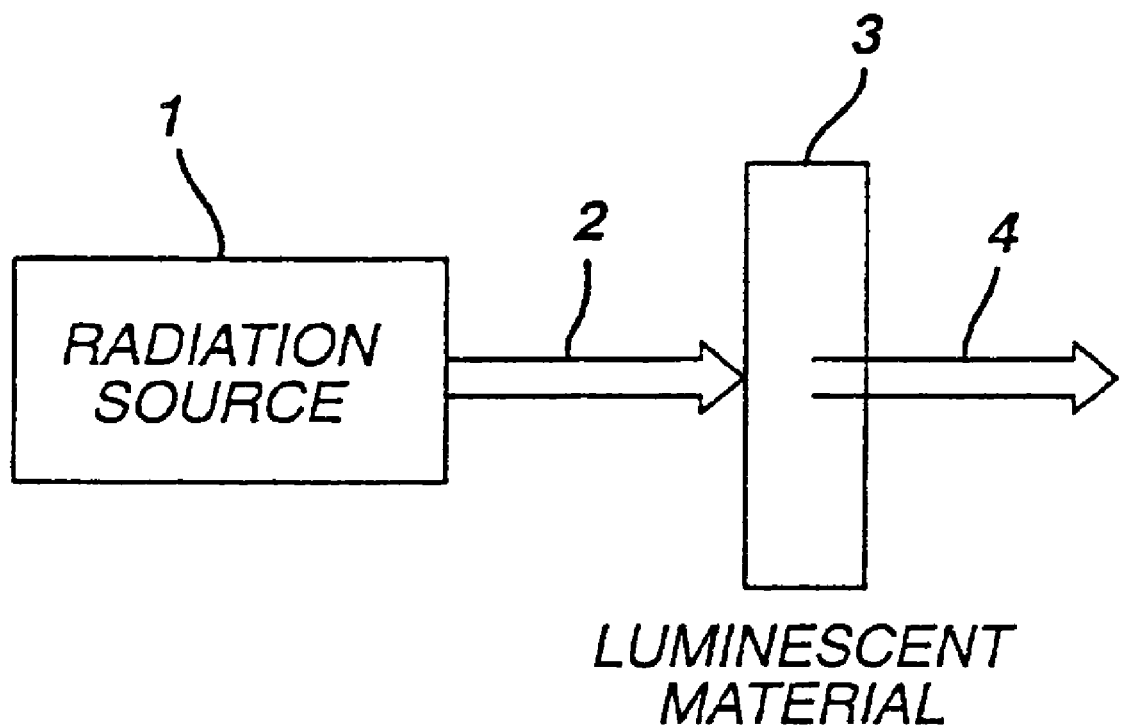
FIG. 1 is a schematic representation of the absorbance and emission of radiation by phosphor materials.

FIG. 1 schematically illustrates the above principle. In FIG. 1, a radiation source 1, such as an LED, emits radiation 2 incident on the phosphor layer 3. The phosphor layer may be an individual phosphor or a phosphor blend of two or more phosphor compositions, including individual phosphors that convert radiation at a specified wavelength, for example radiation from about 250 to 550 nm as emitted by a UV to visible LED, into a different wavelength visible light. Depending on the identity of the radiation source, the radiation 2 may have a peak wavelength ranging from the UV to blue/violet region. After absorbing the incident radiation 2, the phosphor layer 3 emits light having a first peak wavelength a second peak emission wavelength. This light emitted by the phosphor layer will make up in whole or in part a blue-green or green light 4 subsequently emitted by the device.

This emitted light 4 may comprise light having a color solely determined by the phosphor layer or by a combination of the LED and the phosphor layer. After absorbing the incident radiation 2, the one or more phosphors of the phosphor layer 3 emit light 4 having a first peak wavelength and light 5 having a second peak emission wavelength. Light 4 and light 5 are schematically shown as coming from different portions of phosphor 3 for illustration purposes only. Light 4 and light 5 are preferably emitted from the same portions of the phosphor 3.

One way to prevent the LED emission 2 from affecting the color output of the system is by using a radiation source that emits radiation at a wavelength that is not significantly visible to the human eye. Another way to avoid having the LED emission affect the color output of the system is by using a thick phosphor layer which does not allow the radiation from the radiation source to pass through it. In both such cases, the color of the visible light emitted by the system is solely or almost entirely dependent on the type of luminescent material used. Therefore, in order for the LED-phosphor system to emit blue-green light, the phosphor should emit blue-green light when it is irradiated by the LED radiation.

Alternately, the emitted light 4 may be made up of a residual emission from the LED passing through the phosphor layer as well as the emission from the phosphor layer. The human observer perceives the combination of the residual LED light and the light emitted by the phosphor layer as the emitted blue-green light 4.

In one preferred aspect of the present invention, the blue-green light 6 has emission CIE color coordinates located within an area of a quadrilateral on a CIE chromaticity diagram, whose corners have the following color coordinates:
 a) x=0.000 and y=0.506;
 b) x=0.224 and y=0.389;
 c) x=0.280 and y=0.450; and
 d) x=0.000 and y=0.730.

These color coordinates are particularly advantageous for green traffic light applications because they are within the ITE green traffic light bin delineated by the quadrilateral a-b-c-d illustrated in FIG. 2.

In another preferred aspect of the present invention, the blue-green light 6 has emission CIE color coordinates located within an area of a quadrilateral on a CIE chromaticity diagram, whose corners have the following color coordinates:
 e) x=0.037 and y=0.4831;
 f) x=0.2094 and y=0.3953;
 g) x=0.2879 and y=0.5196; and
 h) x=0.0108 and y=0.7220.

These color coordinates are particularly advantageous for green automotive display applications because they are within the SAE green automotive display bin delineated by the quadrilateral e-f-g-h illustrated in FIG. 2. The color coordinates may be used in displays other than automotive displays, if desired.

In another preferred aspect of the present invention, the blue-green light 6 has emission CIE color coordinates located within an area of a pentagon on a CIE chromaticity diagram, whose corners have the following color coordinates:
 e) x=0.0137 and y=0.4831;
 b) x=0.2240 and y=0.3890;
 c) x=0.2800 and y=0.4500;
 g) x=0.2879 and y=0.5196; and
 h) x=0.0108 and y=0.7220.

Figure 3:
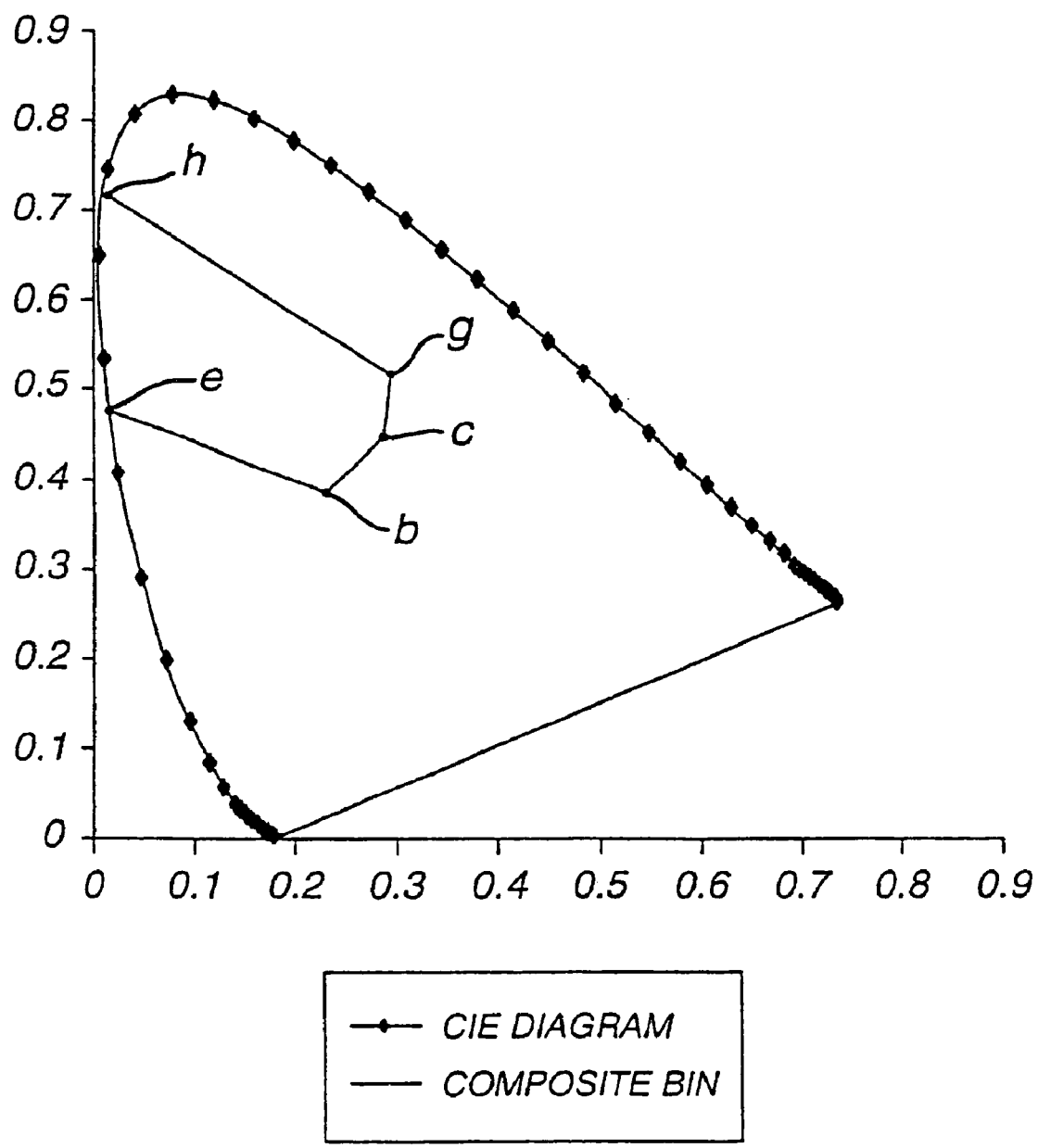
FIG. 3 a representation of the composite bin for green traffic light signals.

The pentagon e-b-c-g-h is illustrated in FIG. 3. These color coordinates are advantageous for both green traffic light and automotive display applications because the area of the pentagon e-b-c-g-h includes the areas of both quadrilaterals a-b-c-d and e-f-g-h illustrated in FIG. 2. As shown in FIGS. 2 and 3, side e-h of the pentagon and the quadrilateral may be slightly bowed to follow the contour of the chromaticity curve. Preferably, the light 6 has the CIE color coordinates of x=0.1±0.05 and y=0.52±0.05.

According to the second preferred aspect of the present invention, a combination of at least two luminescent materials, such as phosphors, produce the desired spectral power distribution which corresponds to a color point in the pentagon e-b-c-g-h. For example, the at least two luminescent materials may comprise a blend or mixture of two or more phosphors or it may comprise two or more discrete overlaying phosphors. The combination of the two or more phosphors has a combined emission with CIE color coordinates that are located inside the area of pentagon e-b-c-g-h in FIG. 3 and/or are within the range of x=0.1±0.05 and y=0.52±0.05. Preferably, the phosphors making up the phosphor layer include two or more phosphors selected from the group of phosphors including:

$(Ba,Sr,Ca)_5(PO_4)_3(Cl,F,Br,OH):Eu^{2+}$
$(Ba,Sr,Ca)MgAl_{10}O_{17}:Eu^{2+}$
$(Ba,Sr,Ca)BPO_5:Eu^{2+}$
$(Sr,Ca)_{10}(PO_4)_6*nB_2O_3:Eu^{2+}$
$2SrO*0.84P_2O_5*0.16B_2O_3:Eu^{2+}$
$Sr_2Si_3O_8*2SrCl_2:Eu^{2+}$
$Ba_3MgSi_2O_8:Eu^{2+}$
$Sr_4Al_{14}O_{25}:Eu^{2+}$ (SAE)
$BaAl_8O_{13}:Eu^{2+}$
$(Ba,Sr,Ca)Al_2O_4:Eu^{2+}$
$(Ba,Sr,Ca)Al_{2-x}Si_xO_{4-x}N_x:Eu^{2+}$
$(Ba,Sr,Ca)_2SiO_4:Eu^{2+}$
$(Ba,Sr,Ca)_2(Mg,Zn)Si_2O_7:Eu^{2+}$
$(Sr,Ca,Ba)(Al,Ga,In)_2S_4:Eu^{2+}, Ce^{3+}$
$(Ca,Sr)_8(Mg,Zn)(SiO_4)_4Cl_2:Eu^{2+}$
$((Y,Lu,Gd,Tb,Sc)_2(Ca,Mg)_{1-r}(Mg,Zn)_{2+r}Si_{z-q}Ge_qO_{12+\delta}:Ce$
$(Y,Gd,Tb,La,Sm,Pr,Lu)_3(Al,Ga)_5O_{12}:Ce^{3+}$
Sr—SiON:$Eu^{2+},Ce^{3+}$
$MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$ and $M_xSi_5AlON_{10}$ where M can be a divalent cation like $Ca^{2+}$, $Sr^{2+}$, $Ba^{2+}$ or a trivalent cation like Y/Lu/Gd/Sc/Tb/La doped with $Eu^{2+}$ and/or $Ce^{3+}$
(Mg, Ca, Sr, Ba)$_p Si_q Al_r O_x N_y$, where $1 \leq p \leq 16$; $0 \leq q < 30$; $0 \leq r < 15$, $0 \leq x < 20$ and $0 < y < 40$ doped with $Eu^{2+}$ and/or $Ce^{3+}$ The above described phosphors are advantageous because they exhibit high quantum efficiency and strong absorption at the long UV blue/violet wavelengths between 350 nm and 480 nm. Therefore, these phosphors are advantageous for use in a blue-green illumination system that uses an LED radiation source having a peak emission wavelength between 350 and 480 nm. However, phosphors other than those described above may be used if these phosphors contain at least two emission wavelengths whose emission CIE color coordinates are located within an area of pentagon e-b-c-g-h in FIG. 3.

In one aspect of the present invention, the two or more phosphors may be used together in a phosphor mixture or blend to produce the desired spectral power distribution which achieves the desired color point in the pentagon e-b-c-g-h in FIG. 3. Alternatively the above mentioned phosphors may be placed into the same illumination system as overlying layers rather than as a blend. The phosphors may be used in any appropriate combination.

In the preferred phosphor combination, the phosphor layer includes a phosphor blend of $Sr_4Al_{14}O_{25}:Eu^{2+}$ (SAE) and at least one of $(Ba,Sr,Ca)Al_2O_4:Eu^{2+}$ (HALO), $(Sr,Ba)_2SiO_4:Eu^{2+}$, or $(Ca,Sr)_8(Mg,Zn)(SiO_4)_4Cl_2:Eu^{2+}$. A first particularly preferred phosphor blend includes $Sr_4Al_{14}O_{25}:Eu^{2+}$, $SrAl_2O_4:Eu^{2+}$ and $Ca_8(SiO_4)_4Cl_2:Eu^{2+}$. A second preferred blend includes $SrAl_2O_4:Eu^{2+}$ and SAE.

Figure 4:
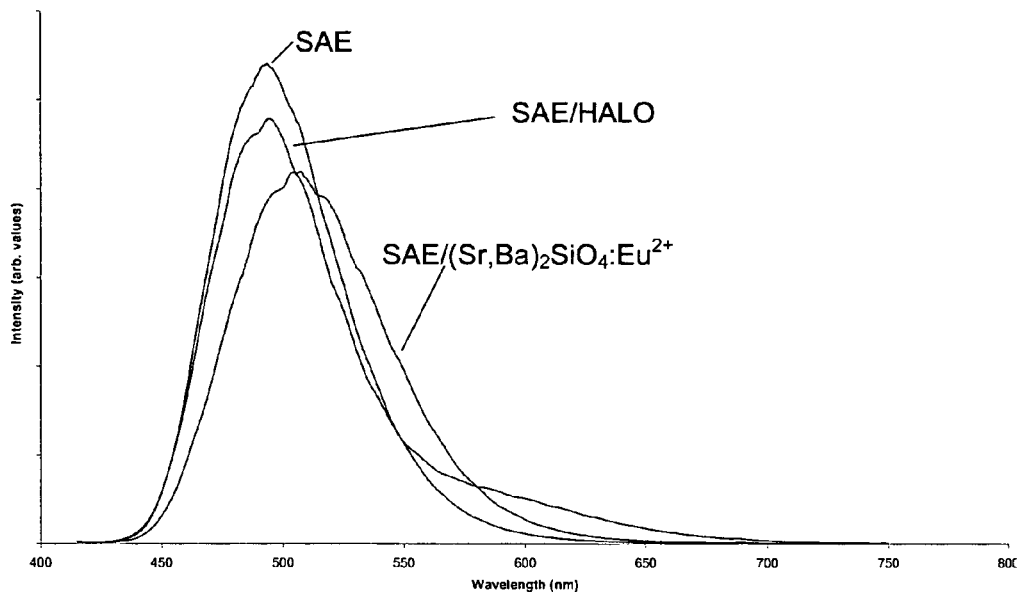
FIG. 4 is a graph of the emission spectra of several individual phosphors and phosphor blends.
Figure 5:
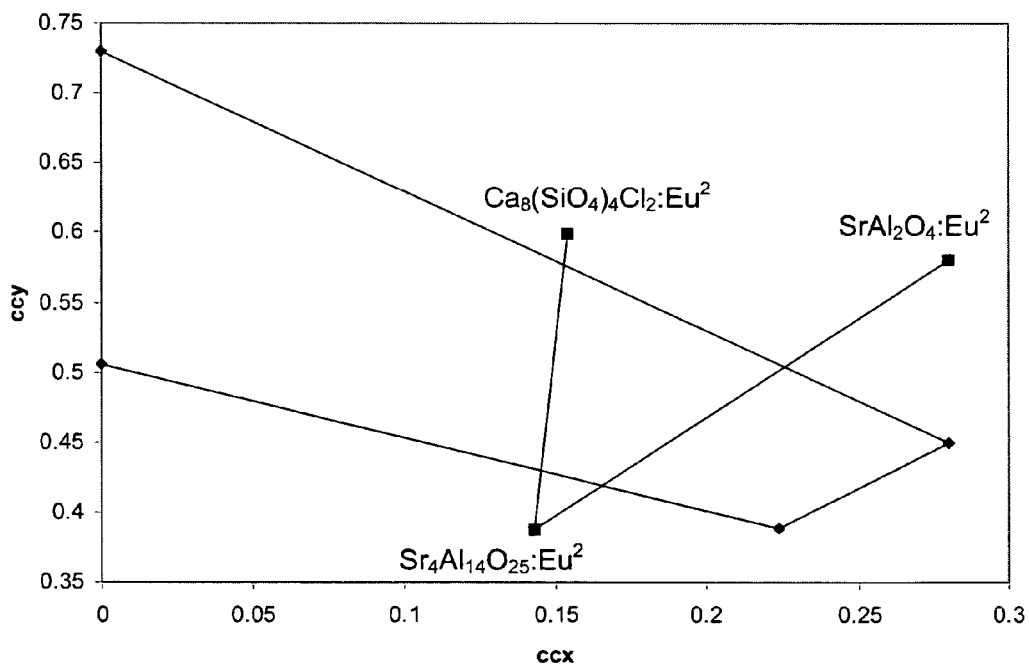
FIG. 5 is a depiction of the color points for individual phosphors on the CIE chromaticity diagram.

FIG. 4 is a graph of the emission spectra under 405 nm excitation for an SAE phosphor alone, a blend of SAE and HALO, and a blend of SAE and $(Sr,Ba)_2SiO_4:Eu^{2+}$. FIG. 5 shows the color points for the individual phosphors $Sr_4Al_{14}O_{25}:Eu^{2+}$, $SrAl_2O_4:Eu^{2+}$ and $Ca_8(SiO_4)_4Cl_2:Eu^{2+}$. It can be seen that a blend containing ⅓ spectral weight of each phosphor would have a color point within the ITE green traffic light bin.

Figure 6:
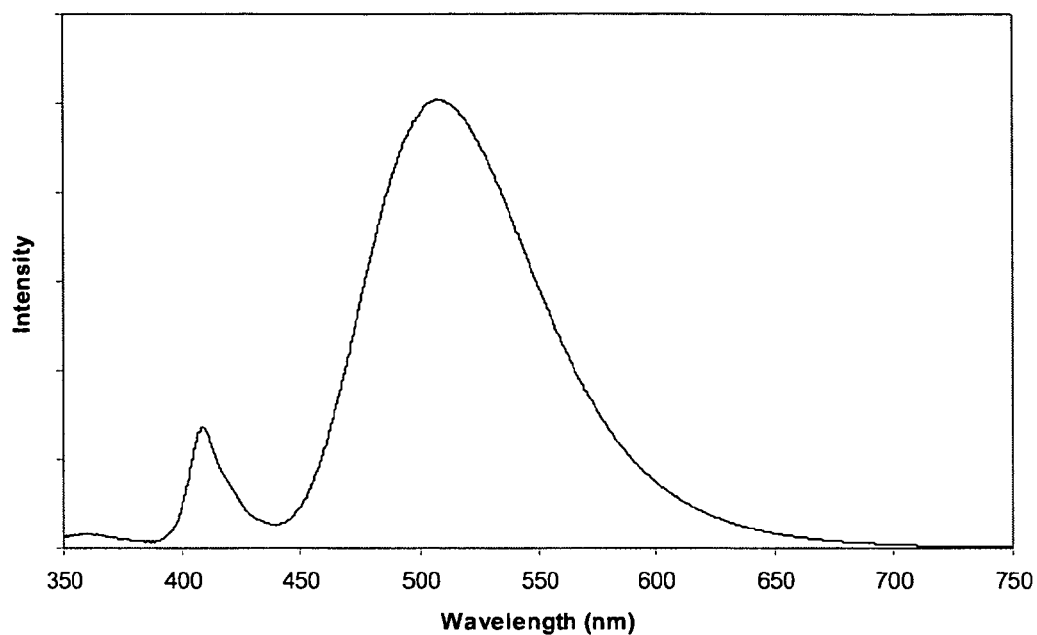
FIG. 6 is a graph of the emission spectra of a present embodiment phosphor blend.
Figure 7:
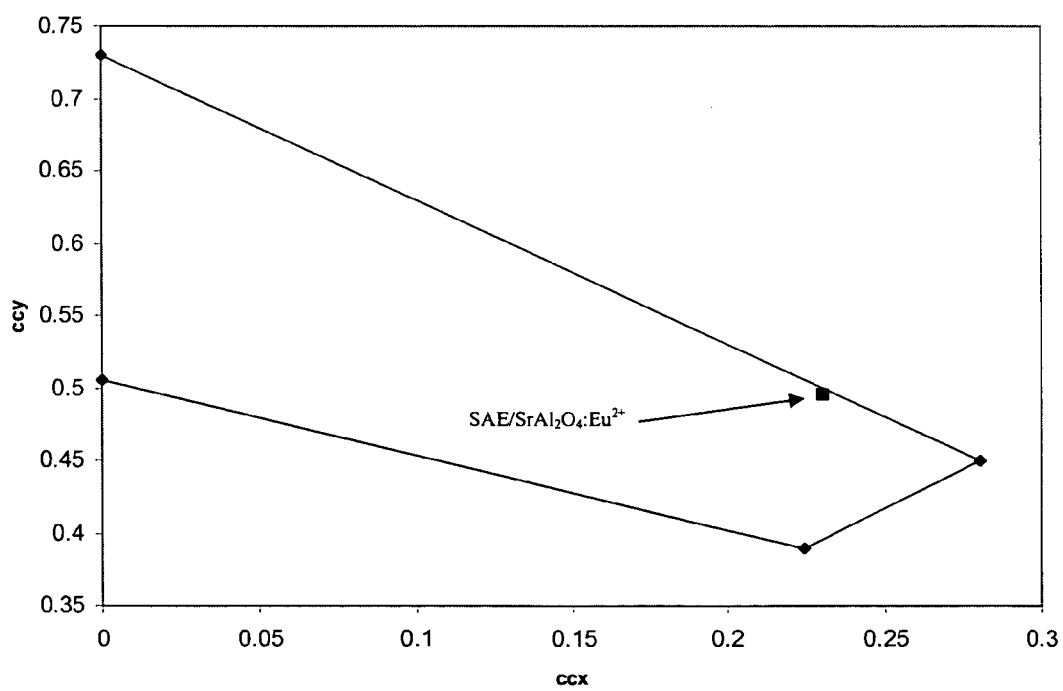
FIG. 7 is a depiction of the color point for the phosphor blend of FIG. 6 on the CIE chromaticity diagram.

Likewise FIG. 6 shows the emission spectrum under 405 nm excitation of a 50:50 spectral weight blend of $SrAl_2O_4$:

$Eu^{2+}$ and $Sr_2SiO_4:Eu^{2+}$. FIG. 7 shows that such a blend has a color point within the ITE green traffic light bin.

The radiation source 1 may comprise any radiation source capable of causing a blue-green emission 6 from the phosphor 3, as illustrated in FIG. 1. Preferably, the radiation source 1 comprises an LED. However, the radiation source 1 may also comprise a gas, such as mercury in a fluorescent lamp. Thus, the blue-green light illumination system may comprise a fluorescent lamp containing the blue-green emitting phosphor. These illumination systems may be used as a green light of a traffic light.

According to the first preferred embodiment of the present invention, the phosphor 3 is placed into a blue-green light illumination system containing an LED. The LED may be any LED which, together with the phosphor layer 3, emits blue-green radiation 6. Thus, the LED may comprise a semiconductor diode based on any suitable III-V, II-VI or IV-IV semiconductor layers and having an emission wavelength of 480 nm and below. For example, the LED may contain at least one semiconductor layer based on GaN, ZnSe or SiC semiconductors. The LED may also contain one or more quantum wells in the active region, if desired. Preferably, the LED active region may comprise a p-n junction comprising GaN, AlGaN and/or InGaN semiconductor layers. The p-n junction may be separated by a thin undoped InGaN layer or by one or more InGaN quantum wells. The LED may have an peak emission wavelength between 350 and 480 nm. The radiation source is described herein as an LED for convenience. However, as used herein, the term is meant to encompass all semiconductor radiation sources including, e.g., semiconductor laser diodes.

Figure 8:
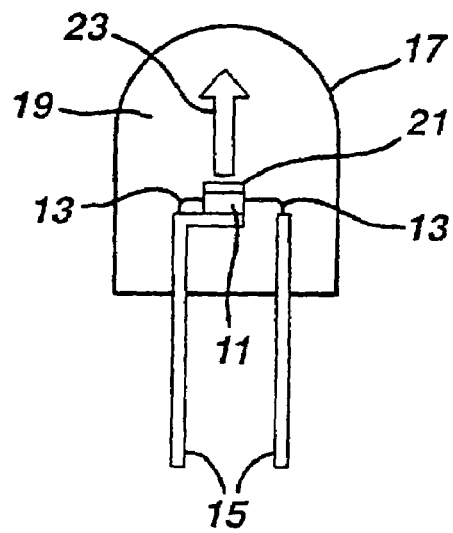
FIG. 8 is a schematic cross-sectional view of an illumination system in accordance with one embodiment.

The structure of the illumination systems according to the present embodiments include a phosphor material radiationally coupled to an LED chip. Radiationally coupled means that the elements are associated with each other so radiation from one is transmitted to the other. The blue-green light illumination system according to the preferred embodiment of the present invention may have various different structures. A first preferred structure is schematically illustrated in FIG. 8. The illumination system includes a light emitting diode chip 11 and leads 13 electrically attached to the LED chip. The leads 13 may comprise thin wires supported by a thicker lead frame(s) 15 or the leads may comprise self supported electrodes and the lead frame may be omitted. The leads 13 provide current to the LED chip 11 and thus cause the LED chip 11 to emit radiation.

The LED chip 11 is encapsulated within a shell 17 which encloses the LED chip and an encapsulant material 19. The shell 17 may be, for example, glass or plastic. The encapsulant material preferably comprises a UV resistant epoxy. However, a separate shell 17 may be omitted and the outer surface of the encapsulant material 19 may comprise the shell 17. The LED chip 11 may be supported, for example, by the lead frame 15, by the self supporting electrodes, the bottom of the shell 17 or by a pedestal (not shown) mounted to the shell or to the lead frame.

The first preferred structure of the illumination system includes a phosphor layer 21 comprising two or more phosphor compositions. The phosphor layer 21 may be formed over or directly on the light emitting surface of the LED chip 11 by coating and drying a suspension containing the phosphor powder over the LED chip 11. After drying, the phosphor powder forms a solid phosphor layer or coating 21. Both the shell 17 and the encapsulant 19 are preferably transparent to allow blue-green light 23 to be transmitted through those elements.

Figure 9:
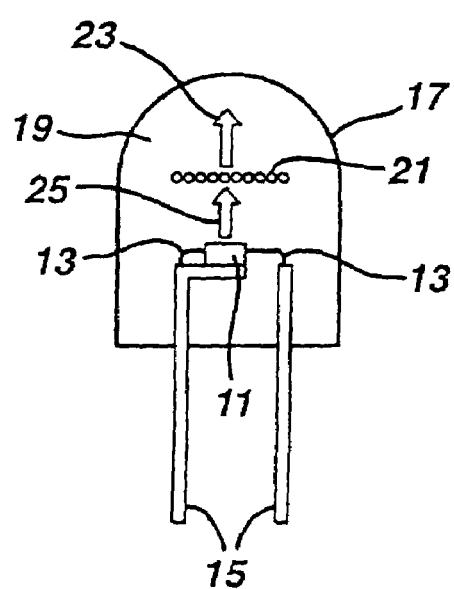
FIG. 9 is a schematic cross-sectional view of an illumination system in accordance with a second embodiment.

FIG. 9 illustrates a second preferred structure of the system according to the first preferred embodiment of the present invention. The structure of FIG. 9 is the same as that of FIG. 8, except that the phosphor powder is interspersed within the encapsulant material 19, instead of being formed over the LED chip 11. The phosphor 3 powder may be interspersed within a single region 21 of the encapsulant material 19 or throughout the entire volume of the encapsulant material. The phosphor powder is interspersed within the encapsulant material, for example, by adding the powder to a polymer precursor, and then curing the polymer precursor to solidify the polymer material. Alternatively, the phosphor powder may be mixed in with the epoxy encapsulant. Other phosphor interspersion methods may also be used. Alternatively, a solid phosphor layer 21 comprising the phosphor compositions may be inserted into the encapsulant material 19 if desired. In this structure, the phosphor absorbs the radiation 25 emitted by the LED and in response, emits blue-green light 23.

Figure 10:
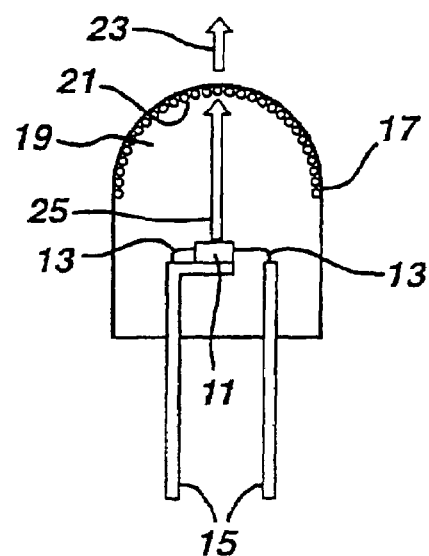
FIG. 10 is a schematic cross-sectional view of an illumination system in accordance with a third embodiment.

FIG. 10 illustrates a third preferred structure of the system according to the first preferred embodiment of the present invention. The structure of FIG. 10 is the same as that of FIG. 8, except that the phosphor layer 21 containing the phosphors is formed on the shell 17, instead of being formed over the LED chip 11. The phosphor layer 21 is preferably formed on the inside surface of the shell 17, although the phosphor layer 21 may be formed on the outside surface of the shell, if desired. The phosphor layer 21 may be coated on the entire surface of the shell or only a top portion of the surface of the shell 17.

Of course, the embodiments of FIGS. 8-10 may be combined and the phosphor may be located in any two or all three locations or in any other suitable location, such as separately from the shell or integrated into the LED. The radiation source 1 of the illumination system has been described above as a semiconductor light emitting diode. However, the radiation source of the present invention is not limited to a semiconductor light emitting diode. For example, the radiation source may comprise a laser diode or an organic light emitting diode (OLED).

Figure 11:
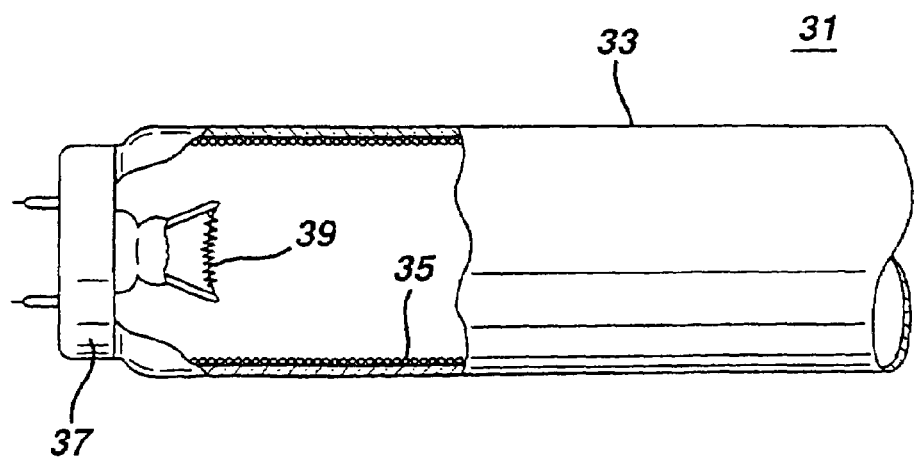
FIG. 11 is a depiction of a fluorescent lamp according to another embodiment.

According to the second preferred embodiment of the present invention, the phosphor blend is placed into an illumination system containing a fluorescent lamp. A portion of a fluorescent lamp is schematically illustrated in FIG. 11. The lamp 31 contains a phosphor coating 35 comprising the phosphor 3 on a surface of the lamp cover 33, preferably the inner surface. The fluorescent lamp 31 also preferably contains a lamp base 37 and a cathode 39. The lamp cover 33 encloses a gas, such as mercury, which emits UV radiation in response to a voltage applied to the cathode 39.

Figure 12:
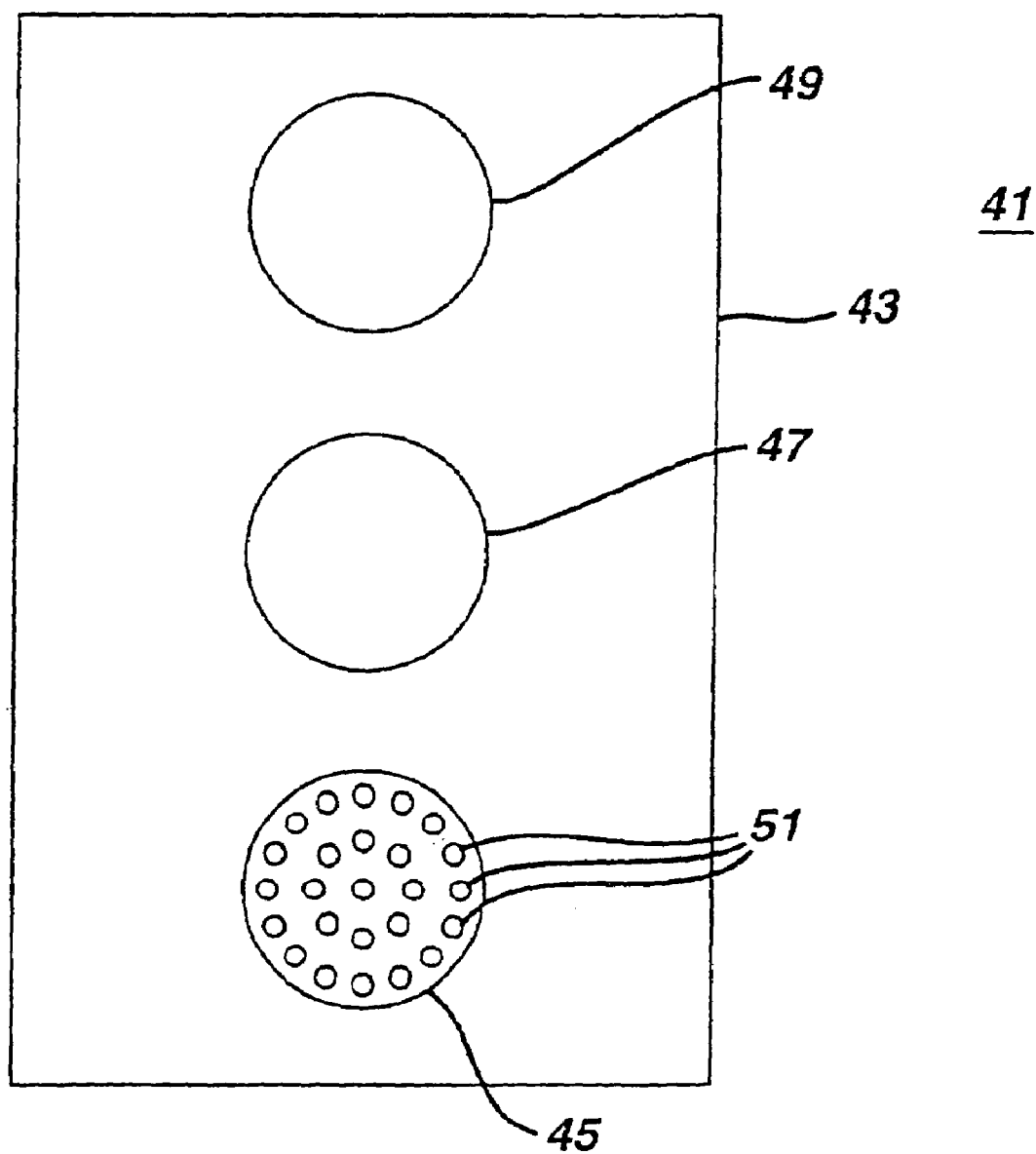
FIG. 12 is a depiction of a traffic signal containing an LED according to another embodiment.

According another embodiment, the illumination system comprises a traffic signal including a green traffic light which contains a plurality of the LED-phosphor or lamp-phosphor systems of the first or the second preferred embodiments as the green light source of the traffic signal. The traffic signal 41 is illustrated in FIG. 12. The traffic signal contains a base or a housing 43, which contains the light sources and the electronics which switch the individual light sources of the traffic signal on and off. A plurality of lenses are included in openings in the housing 43. Preferably, the traffic signal contains a green lens 45, a yellow lens 47 and a red lens 49. Each lens may comprise clear or colored plastic or glass. If the light source emits only one color light (i.e., green, yellow or red), then the lens may be clear. However, if the light source emits white light, then the lens should be appropriately colored.

A plurality of light sources 51 described above are arranged inside the housing 43 behind the green lens 45. Each light source 51 contains a radiation source, such as an LED 11 or fluorescent lamp 31 and a luminescent material, such as the phosphor blend. The light sources 51 may be arranged in any manner around the green lens 45 in order to provide a high blue-green light output through the lens 45. The traffic signal may contain several light sources to one hundred or more light sources, as desired. While less preferred, a single, large area light source 51 may be used instead.

According to the fourth preferred embodiment of the present invention, the illumination system comprises an automotive display which contains a plurality of the LED-phosphor systems (not shown). Preferably, the automotive display is a vehicle dashboard display, such as a clock, an odometer display or a speedometer display. The system may also be used in non-automotive displays if desired.

In any of the above structures, the lighting device may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

The specific amounts of the individual phosphors used in the phosphor blend will depend upon the desired color point. The relative amounts of each phosphor in the phosphor blend can be described in terms of spectral weight. The spectral weight is the relative amount that each phosphor contributes to the overall emission spectrum of the device. The spectral weight amounts of all the individual phosphors and any residual bleed from the LED source should add up to 100%. In a preferred embodiment of blended phosphors, each of the phosphors in the blend will have a spectral weight ranging from about 1 to 75%.

The above described phosphor compositions may be produced using known solution or solid state reaction processes for the production of phosphors by combining, for example, elemental oxides, carbonates and/or hydroxides as starting materials. Other starting materials may include nitrates, sulfates, acetates, citrates, or oxalates. Alternately, coprecipitates of the rare earth oxides could be used as the starting materials for the RE elements. In a typical process, the starting materials are combined via a dry or wet blending process and fired in air or under a reducing atmosphere at from, e.g., 1000 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 1500° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate but for phase formation it is desirable to refire couple of times at the desired temperatures after grinding. The reducing atmosphere typically comprises a reducing gas such as hydrogen, carbon monoxide, or a combination thereof, optionally diluted with an inert gas, such as nitrogen, helium, etc., or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate is typically filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried but at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials or using ammonia gas to covert all of the calcined material to the desired phosphor composition.

Alternatively, a sol-gel synthesis may also be used to produce the phosphors of the present invention. Thus, in an exemplary process, a phosphor for use in the present invention can be made by first combining predetermined amounts of appropriate oxide compounds and wetting them with water. Dilute nitric acid is then added to dissolve the oxide and carbonates. The solution is then dried to remove excess nitric acid and then dissolved in absolute ethanol. In a second container, a predetermined amount of tetraethyl orthosilicate (TEOS) is dissolved in absolute ethanol. The contents of the two containers are then combined and stirred under heat until gelling occurs. The gel is subsequently heated in an oven to remove organics, ground to a powder, and then calcined at 800-1200° C. Finally, the powder may be ground again and further calcined in 1% $H_2$ reducing atmosphere at 1400° C. for 5 hours. Calcination in ammonia gas is desirable for the formation of the desired phase especially when using all oxide/hydroxide precursors. Similar procedures can be used for the other described phosphors.

It may be desirable to add pigments or filters to the phosphor composition. When the LED is a UV emitting LED, the phosphor layer 22 may also comprise from 0 up to about 5% by weight (based on the total weight of the phosphors) of a pigment or other UV absorbent material capable of absorbing or reflecting UV radiation having a wavelength between 250 nm and 450 nm. Suitable pigments or filters include any of those known in the art that are capable of absorbing radiation generated between 250 nm and 450 nm. Such pigments include, for example, nickel titanate or praseodimium zirconate. The pigment is used in an amount effective to filter 10% to 100% of the radiation generated in the 250 nm to 450 nm range.

The individual phosphors in the phosphor blend are blended or mixed together to form the phosphor powder blend or mixture. The powders may be manually blended in a crucible or mechanically blended in another suitable container, such as a ball mill. The single phosphor powder or the phosphor powder blend is then placed into the illumination system. For example, the phosphor powder or powder blend may be placed over the LED chip, interspersed into the encapsulant material or coated onto the surface of the shell, as described above with respect to the first preferred embodiment of the present invention.

If the phosphor powder or powder blend is coated onto the LED chip or the shell, then preferably, a suspension of the phosphor powder and a liquid is used to coat the LED chip or the shell surface. The suspension may also optionally contain a binder in a solvent. Preferably, the binder comprises an organic material, such as nitrocellulose or ethylcellulose, in a solvent such as butyl acetate or xylol. The binder enhances the adhesion of the powder particles to each other and to the LED or the shell. However, the binder may be omitted to simplify processing, if desired. In another process for example, a water based suspension of the phosphor(s) can be formed, and applied as a phosphor layer to the LED surface. In one such method, a silicone slurry in which the phosphor particles are randomly suspended is placed around the LED. After coating, the suspension is dried and may be heated to evaporate the binder. The phosphor powder acts as the phosphor layer after drying the solvent. Although not intended to be limiting, in one embodiment, the median particle size of the phosphor material may be from about 1 to about 10 microns.

If the phosphor powder or powder blend is to be interspersed within the encapsulant material, then the phosphor powder may be added to a polymer precursor, and then the polymer precursor may be cured to solidify the polymer material. Alternatively, the phosphor powder may be mixed in with the epoxy encapsulant. Other phosphor interspersion methods may also be used.

If the phosphor powder or powder blend is placed into a fluorescent lamp, then a suspension of the phosphor powder and a liquid is used to coat the lamp interior surface. The suspension may also optionally contain a binder in a solvent, as described above.

While one phosphor coating method has been described as a coating of a phosphor blend, the first and the second phosphors may be formed as overlying, individual layers on a surface of the illumination system. Furthermore, the luminescent material(s) may comprise single crystal scintillator material(s) instead of or in addition to the phosphors, if desired. The scintillators may be made by any scintillator fabrication method. For example, the scintillators may be formed by Czochralski, float zone, or other crystal growing methods. The scintillators may then be placed over the LED chip or used as the shell or as a top portion of the shell of the illumination system.

By assigning appropriate spectral weights for each phosphor, we can create spectral blends to cover the relevant portions of color space, especially for green traffic lights. For various desired CCT's, CRI's and color points, one can determine the appropriate amounts of each phosphor to include in the blend. Thus, one can customize phosphor blends to produce almost any CCT or color point, with corresponding high CRI. Of course, the color of each phosphor will be dependent upon its exact composition. However, determining the changes in the spectral weight to produce the same or similar characteristic lighting device necessitated by such variations is trivial and can be accomplished by one skilled in the art using various methodologies, such as design of experiment (DOE) or other strategies.

The phosphor composition described above may be used in additional applications besides LEDs. For example, the material may be used as a phosphor in a Hg fluorescent lamp, in a cathode ray tube, in a plasma display device or in a liquid crystal display (LCD). The material may also be used as a scintillator in an electromagnetic calorimeter, in a gamma ray camera, in a computed tomography scanner, as scintillator detector elements in a CT or PET system, or in a laser. These uses are meant to be merely exemplary and not exhaustive.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

What is claimed is:

1. A blue-green light emitting system, comprising a semiconductor light emitter; and a luminescent material, wherein said illumination system has an emission having CIE color coordinates located within an area of a pentagon on a CIE chromaticity diagram, whose corners have the following CIE color coordinates:

e) x=0.0137 and y=0.4831;
   b) x=0.2240 and y=0.3890;
   c) x=0.2800 and y=0.4500;
   g) x=0.2879 and y=0.5196; and
   h) x=0.0108 and y=0.7220.

wherein said luminescent material comprises two or more phosphor compositions selected from the group consisting of: $(Ba,Sr,Ca)_5(PO_4)_3(Cl,F,Br,OH):Eu^{2+}$; $(Ba,Sr,Ca)MgAl_{10}O_{17}:Eu^{2+}$; $(Ba,Sr,Ca)BPO_5:Eu^{2+}$; $(Sr,Ca)_{10}(PO_4)_6*nB^2O_3:Eu^{2+}$ where n>0; $2SrO*0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_{2-x}Si_xO_{4-x}N_x:Eu^{2+}$ where $x\leq 2$; $(Ba,Sr,Ca)_2SiO_4:Eu^{2+}$; $(Sr,Ca,Ba)(Al,Ga,In)_2S_4:Eu^{2+},Ce^{3+}$; $(Ca,Sr)_8(Mg,Zn)(SiO_4)_4Cl_2:Eu^{2+}$; $(Y,Lu,Gd,Tb,Sc)_2(Ca,Mg)_{1-r}(Mg,Zn)_{2+r}Si_{z-q}Ge_qO_{12+\delta}:Ce$ where $r\leq 1$ and $z,q,\delta\geq 0$; $(Y,Gd,Tb,La,Sm,Pr,Lu)_3(Al,Ga)_5O_{12}:Ce^{3+}$; $Sr-SiON:Eu^{2+},Ce^{3+}$; $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$ and $M_3Si_5AlON_{10}$ where M can be a divalent cation or a trivalent cation doped with $Eu^{2+}$ and/or $Ce^{3+}$; and $(Mg,Ca,Sr,Ba)_pSi_qAl_rO_xN_y$, where $1\leq p\leq 16$; $0\leq q<30$; $0\leq r<15$, $0\leq x<20$ and $0<y<40$ doped with $Eu^{2+}$ and/or $Ce^+$.

2. The system of claim 1, wherein the light emitting diode peak emission wavelength is between 350 and 480 nm.

3. The system of claim 1, wherein the system's emission CIE color coordinates are x=0.1±0.05 and y=0.52±0.05.

4. The system of claim 1, wherein the emission CIE color coordinates of the luminescent material are located within an area of a quadrilateral on a CIE chromaticity diagram, whose corners have the following CIE color coordinates:
    a) x=0.000 and y=0.506;
    b) x=0.224 and y=0.389;
    c) x=0.280 and y=0.450; and
    d) x=0.000 and y=0.730.

5. The system of claim 1, wherein the emission CIE color coordinates of the luminescent material are located within an area of a quadrilateral on a CIE chromaticity diagram, whose corners have the following CIE color coordinates:
    e) x=0.0137 and y=0.4831;
    f) x=0.2094 and y=0.3953;
    g) x=0.2879 and y=0.5196; and
    h) x=0.0108 and y=0.7220.

6. The system of claim 1, wherein said luminescent material comprises a blend of $Sr_4Al_{14}O_{25}:Eu^{2+}$ and at least one of $(Sr,Ba)_2SiO_4:Eu^{2+}$, or $(Ca,Sr)_8(Mg,Zn)(SiO_4)_4Cl_2:Eu^{2+}$.

7. The system of claim 1, wherein said semiconductor light emitter comprises a light emitting diode.

8. The system of claim 7, further comprising:
    a shell containing the light emitting diode;
    an encapsulating material between the shell and the light emitting diode; and wherein:
        a) the phosphor is coated over a surface of the light emitting diode;
        b) the phosphor is interspersed in the encapsulating material; or
        c) the phosphor is coated onto the shell.

9. The system of claim 1, further comprising a traffic signal housing containing the blue-green illumination system and a traffic light lens in front of the blue-green illumination system.

10. The system of claim 1, further comprising an automotive display containing the blue-green illumination system.

11. A traffic signal, comprising:
    a housing;
    at least one lens;
    a radiation source having a peak emission wavelength of 480 nm or below; and
    a luminescent material, wherein said signal has an emission having CIE color coordinates located within an area of a quadrilateral on a CIE chromaticity diagram, whose corners have the following CIE color coordinates:
        a) x=0.000 and y=0.506;
        b) x=0.224 and y=0.389;
        c) x=0.280 and y=0.45; and
        d) x=0.000 and y=0.730.
    wherein said luminescent material comprises two or more phosphor compositions selected from the group consisting of: $(Ba,Sr,Ca)_5(PO_4)_3(Cl,F,Br,OH):Eu^{2+}$; $(Ba,Sr,Ca)MgAl_{10}O_{17}:Eu^{2+}$; $(Ba,Sr,Ca)BPO_5:Eu^{2+}$; $(Sr,Ca)_{10}(PO_4)_6*nB_2O_3:Eu^{2+}$ where n>0; $2SrO0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Ba,Sr,Ca)Al_{2-x}Si_xO_{4-x}N_x:Eu^{2+}$ where x≦2; $(Sr,Ca,Ba)(Al,Ga,In)_2S_4:Eu^{2+},Ce^{3+}$; $(Ca,Sr)_8(Mg,Zn)(SiO_4)_4Cl_2:Eu^{2+}$; $(Y,Lu,Gd,Tb,Sc)_2(Ca,Mg)_{1-r}(Mg,Zn)_{2+r}Si_{z-q}Ge_qO_{12+\delta}:Ce$ where r≦1 and z,q,δ≧0; $(Y,Gd,Tb,La,Sm,Pr,Lu)_3(Al,Ga)_5O_{12}:Ce^{3+}$; $Sr-SiON:Eu^{2+},Ce^{3+}$; $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$ and $M_3Si_5AlON_{10}$ where M can be a divalent cation or a trivalent cation doped with $Eu^{2+}$ and/or $Ce^{3+}$; and $(Mg,Ca,Sr,Ba)_pSi_qAl_rO_xN_y$, where 1≦p≦16; 0≦q<30; 0≦r<15, 0≦x<20 and 0<y<40 doped with $Eu^{2+}$ and/or $Ce^{3+}$.

12. The traffic signal of claim 11, wherein the radiation source comprises a light emitting diode or a fluorescent lamp.

13. The traffic signal of claim 11, wherein said luminescent material comprises a blend of $Sr_4Al_{14}O_{25}:Eu^{2+}$ and at least one of $(Ba,Sr,Ca)Al_2O_4:Eu^{2+}$, or $(Ca,Sr)_8(Mg,Zn)(SiO_4)_4Cl_2:Eu^{2+}$.

14. The traffic signal of claim 11, wherein said luminescent material comprises a blend of $Sr_4Al_{14}O_{25}:Eu^{2+}$, $SrAl_2O_4:Eu^{2+}$ and $Ca_8(SiO_4)_4Cl_2:Eu^{2+}$.

15. The traffic signal of claim 11, wherein said luminescent material comprises a blend of $SrAl_2O_4:Eu^{2+}$ and $Sr_4Al_{14}O_{25}:Eu^{2+}$.

16. A blue-green light emitting system, comprising a semiconductor light emitter; and a luminescent material, wherein said illumination system has an emission having CIE color coordinates located within an area of a pentagon on a CIE chromaticity diagram, whose corners have the following CIE color coordinates:
    e) x=0.0137 and y=0.4831;
    b) x=0.2240 and y=0.3890;
    c) x=0.2800 and y=0.4500;
    g) x=0.2879 and y=0.5196; and
    h) x=0.0108 and y=0.7220;
wherein said luminescent material comprises two or more phosphor compositions selected from the group consisting of: $(Ba,Sr,Ca)_5(PO_4)_3(Cl,F,Br,OH):Eu^{2+}$; $(Ba,Sr,Ca)MgAl_{10}O_{17}:Eu^{2+}$; $(Ba,Sr,Ca)BPO_5:Eu^{2+}$; $(Sr,Ca)_{10}(PO_4)_6*nB_2O_3:Eu^{2+}$ where n>0; $2SrO*0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Ba,Sr,Ca)Al_{2-x}Si_xO_{4-x}N_x:Eu^{2+}$ where x≦2; $(Sr,Ca,Ba)(Al,Ga,In)_2S_4:Eu^{2+},Ce^{3+}$; $(Ca,Sr)_8(Mg,Zn)(SiO_4)_4Cl_2:Eu^{2+}$; $(Y,Lu,Gd,Tb,Sc)_2(Ca,Mg)_{1-r}(Mg,Zn)_{2+r}Si_{z-q}Ge_qO_{12+\delta}:Ce$ where r≦1 and z,q,δ≧0; $(Y,Gd,Tb,La,Sm,Pr,Lu)_3(Al,Ga)_5O_{12}:Ce^{3+}$; $Sr-SiON:Eu^{2+},Ce^{3+}$; $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$ and $M_3Si_5AlON_{10}$ where M can be a divalent cation or a trivalent cation doped with $Eu^{2+}$ and/or $Ce^{3+}$; and $(Mg,Ca,Sr,Ba)_pSi_qAl_rO_xN_y$, where 1≦p≦16; 0≦q<30; 0≦r<15, 0≦x<20 and 0<y<40 doped with $Eu^{2+}$ and/or $Ce^+$.

17. The system of claim 16, wherein said luminescent material comprises a blend of $Sr_4Al_{14}O_{25}:Eu^{2+}$, $SrAl_2O_4:Eu^{2+}$ and $Ca_8(SiO_4)_4Cl_2:Eu^{2+}$.

18. The system of claim 16, wherein said luminescent material comprises a blend of $SrAl_2O_4:Eu^{2+}$ and $Sr_4Al_{14}O_{25}:Eu^{2+}$.

19. A blue-green light emitting system, comprising a semiconductor light emitter; and a luminescent material, wherein said illumination system has an emission having CIE color coordinates located within an area of a pentagon on a CIE chromaticity diagram, whose corners have the following CIE color coordinates:
    e) x=0.0137 and y=0.4831;
    b) x=0.2240 and y=0.3890;
    c) x=0.2800 and y=0.4500;
    g) x=0.2879 and y=0.5196; and
    h) x=0.0108 and y=0.7220;
wherein said luminescent material comprises a blend of $Sr_4Al_{14}O_{25}:Eu^{2+}$ and at least one additional phosphor selected from the group consisting of: $(Ba,Sr,Ca)_5(PO_4)_3(Cl,$ F,Br,OH):$Eu^{2+}$; (Ba,Sr,Ca)$MgAl_{10}O_{17}$:$Eu^{2+}$; (Ba,Sr,Ca)$BPO_5$:$Eu^{2+}$; $(Sr,Ca)_{10}(PO_4)_6 * nB_2O_3$:$Eu^{2+}$ where n>0; 2SrO* $0.84P_2O_5$* $0.16B_2O_3$:$Eu^{2+}$; $Sr_2Si_3O_8 * 2SrCl_2$:$Eu^{2+}$; $Ba_3MgSi_2O_8$:$Eu^{2+}$; $BaAl_8O_{13}$:$Eu^{2+}$; (Ba,Sr,Ca)$Al_2O_4$:$Eu^{2+}$; (Ba,Sr,Ca)$Al_{2-x}Si_xO_{4-x}N_x$:$Eu^{2+}$ where $x \leqq 2$; $(Ba,Sr,Ca)_2SiO_4$:$E^{2+}$; $(Ba,Sr,Ca)_2(Mg,Zn)Si_2O_7$:$Eu^{2+}$; (Sr,Ca,Ba)(Al,Ca,In)$_2S_4$:$Eu^{2+}$,$Ce^{3+}$; $(Ca,Sr)_8(Mg,Zn)(SiO_4)_4Cl_2$:$Eu^{2+}$; $(Y,Lu,Gd,Tb,Sc)_2(Ca,Mg)_{1-r}(Mg,Zn)_{2+r}Si_{z-q}Ge_qO_{12+\delta}$:Ce where $r \leqq 1$ and $z,q,\delta \geqq 0$; $(Y,Gd,Tb,La,Sm,Pr,Lu)_3(Al,Ga)_5O_{12}$:$Ce^{3+}$; Sr—SiON:$Eu^{2+}$,$Ce^{3+}$; $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$ and $M_3Si_5AlON_{10}$ where M can be a divalent cation or a trivalent cation doped with $Eu^{2+}$ and/or $Ce^{3+}$; and $(Mg,Ca,Sr,Ba)_pSi_qAl_rO_xN_y$, where $1 \leqq p \leqq 16$; $0 \leqq q < 30$; $0 \leqq r < 15$, $0 \leqq x < 20$ and $0 < y < 40$ doped with $Eu^{2+}$ and/or $Ce^{3+}$.

* * * * *